(12) United States Patent  (10) Patent No.: US 9,324,383 B2
Li et al.  (45) Date of Patent: Apr. 26, 2016

(54) SOURCE LINE VOLTAGE REGULATION SCHEME FOR LEAKAGE REDUCTION

(71) Applicant: TAIWAN SEMICONDUCTOR MANUFACTURING COMPANY, LTD., Hsinchu (TW)

(72) Inventors: Gu-Huan Li, Zhubei (TW); Hsu-Shun Chen, Toufen Town (TW); Chung-Chieh Chen, New Taipei (TW); Cheng-Hsiung Kuo, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/220,663

(22) Filed: Mar. 20, 2014

(65) Prior Publication Data

US 2015/0269974 A1 Sep. 24, 2015

(51) Int. Cl.
| | |
|---|---|
| *G11C 7/00* | (2006.01) |
| *G11C 5/14* | (2006.01) |
| *G11C 11/408* | (2006.01) |
| *G11C 8/08* | (2006.01) |
| *G11C 7/12* | (2006.01) |
| *G11C 16/24* | (2006.01) |
| *G11C 16/30* | (2006.01) |

(52) U.S. Cl.
CPC ................ *G11C 5/147* (2013.01); *G11C 5/145* (2013.01); *G11C 7/12* (2013.01); *G11C 8/08* (2013.01); *G11C 11/408* (2013.01); *G11C 16/24* (2013.01); *G11C 16/30* (2013.01)

(58) Field of Classification Search
CPC ............ G11C 8/08; G11C 8/04; G11C 5/145; G11C 7/12; G11C 11/4085; G11C 16/30
USPC ................................ 365/189.11, 189.12, 226
See application file for complete search history.

(56) References Cited

U.S. PATENT DOCUMENTS

| | | | | |
|---|---|---|---|---|
| 5,592,421 | A * | 1/1997 | Kaneko et al. | 365/189.09 |
| 6,353,559 | B2 * | 3/2002 | Hasegawa et al. | 365/189.09 |
| 6,822,907 | B2 * | 11/2004 | Maruyama et al. | 365/185.21 |
| 2001/0012219 | A1 * | 8/2001 | Lee et al. | 365/189.09 |
| 2011/0141824 | A1 * | 6/2011 | Fifield et al. | 365/189.07 |

* cited by examiner

*Primary Examiner* — Pho M Luu
(74) *Attorney, Agent, or Firm* — Hauptman Ham, LLP

(57) ABSTRACT

An integrated circuit that includes a generator unit connected to one or more pull-up units, one or more pull-up units connected to one or more source lines and an array of memory cells connected to the one or more source lines. The generator unit is configured to set a first voltage signal of each pull-up unit of the one or more pull-up units. Each pull-up unit of the one or more pull-up units is connected with the corresponding source line of the one or more source lines and is configured to set a current of the corresponding source line of the one or more source lines. The array of memory cells is electrically connected to the one or more source lines and one or more bit lines.

20 Claims, 12 Drawing Sheets

SOURCE LINE VOLTAGE REGULATION SCHEME FOR LEAKAGE REDUCTION

BACKGROUND

The semiconductor integrated circuit (IC) industry has produced a wide variety of digital devices to address issues in a number of different areas. Some of these digital devices, such as non-volatile memory, are used for storing digital data. As ICs have become smaller and more complex, operating voltages continue to decrease affecting IC performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. One or more embodiments illustrated in the drawings, incorporated herein in their entirety, include the following.

DETAILED DESCRIPTION

Figure 1A:
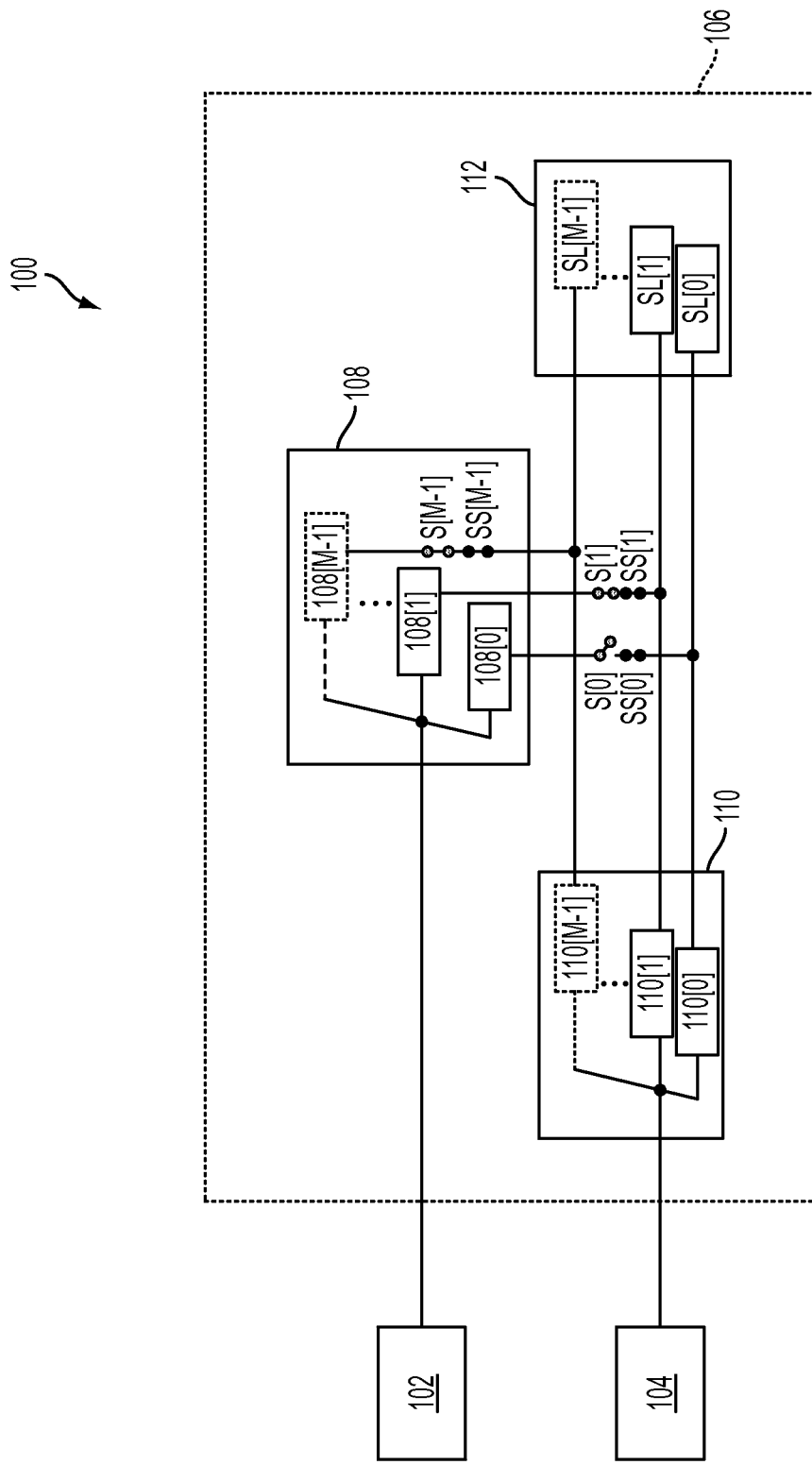
FIG. 1A is a block diagram of a memory unit in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1A is a block diagram of a memory unit 100 in accordance with one or more embodiments. Memory unit 100 includes a generator unit 102, a regulator unit 104 and a local memory unit 106.

Generator unit 102 is connected to local memory unit 106. Generator unit 102 is configured to receive a reference voltage signal (shown in FIGS. 4-6). Generator unit 102 is configured to provide a bias voltage to one or more devices located within local memory unit 106. In some embodiments, generator unit 102 is configured to provide a bias voltage to a pull-up unit 108.

Regulator unit 104 is connected to local memory unit 106. Regulator unit 104 is configured to set a bias voltage of one or more source lines (shown in a memory cell array 112) within local memory unit 106.

Local memory unit 106 is connected to generator unit 102 and regulator unit 104. Local memory unit 106 comprises pull-up unit 108, a source line decoder 110 and memory cell array 112.

Pull-up unit 108 includes one or more local pull-up units 108[0], ... 108[M−1], where M is an integer corresponding to the number of local pull-up units. In some embodiments, M is an integer ranging from 0 to 512. Local pull-up units 108[0], ... 108[M−1] are configured to receive a bias voltage from generator unit 102. Local pull-up units 108[0], ... 108[M−1] are configured to provide a current to source lines SL[0], ... SL[M−1]. Local pull-up units 108[0], ... 108[M−1] are connected to source lines SL[0], ... SL[M−1] and source decoders 110[0], ... 110[M−1] by switches S[0], ... S[M−1] and switches SS[0], ... SS[M−1]. In some embodiments, local pull-up units 108[0], ... 108[M−1] are connected to the source lines SL[0], ... SL[M−1] by either switches S[0], ... S[M−1] or switches SS[0], ... SS[M−1]. In some embodiments, each of the local pull-up units 108[0], ... 108[M−1] are connected to each of the source lines SL[0], ... SL[M−1] by more than two switches. In some embodiments, each local pull-up unit 108[0], ... 108[M−1] is connected to a corresponding source line SL[0], ... SL[M−1].

Source line decoder 110 includes one or more local source line decoders SL[0], ... SL[M−1], where M is an integer ranging from 0 to 512. In some embodiments, local source line decoders SL[0], ... SL[M−1] include source line decoders or source line drivers. In some embodiments, local source line decoder 110[0], ... 110[M−1] determines the corresponding source line of each accessed individual memory cell based on the address of the accessed memory cell.

Memory cell array 112 includes memory cells (shown in FIGS. 2-6) and source lines SL[0], ... SL[M−1], where M is an integer ranging from 0 to 512. Source lines SL[0] ... SL[M−1] are connected to local source line decoders 110[0], ... 110[M−1] and local pull-up units 108[0], ... 108[M−1]. In some embodiments, a single generator unit 102 is associated with one or more local pull-up units 108[0], ... 108[M−1], one or more local source line decoders 110[0], ... 110[M−1] or one or more source lines SL[0], ... SL[M−1] within memory cell array 112. In some embodiments, a single regulator unit 104 is associated with one or more local pull-up units 108[0], ... 108[M−1], one or more local source line decoders 110[0], ... 110[M−1] or one or more source lines SL[0], ... SL[M−1] within memory cell array 112.

Switches S[0], ... S[M−1] are connected to local pull-up units 108[0], ... 108[M−1] and switches SS[0], ... SS[M−1]. In some embodiments, each local pull-up unit 108[0], ... 108[M−1] is connected to a corresponding switch S[0], ... S[M−1]. In some embodiments, each switch S[0], ... S[M−1] is connected to a corresponding switch SS[0], ... SS[M−1]. Switches S[0], ... S[M−1] are configured to operate in an "open state" or a "closed state." In some embodiments, a "closed state" provides an electrical connection between devices connected to the switches S[0], ... S[M−1]. In some embodiments, an "open state" does not provide an electrical connection between devices connected to the switches S[0], ... S[M−1]. In some embodiments, one or more of switches S[0], ... S[M−1] are implemented by an electrical or mechanical device capable of functioning as a switch. In some embodiments, one or more of switches S[0], ... S[M−1] are implemented by the use of NMOS or PMOS transistor devices or a transmission gate. In some embodiments, one or more of switches S[0], ... S[M−1] are implemented by one or more switch devices.

Switches SS[0], ... SS[M−1] are connected to source lines SL[0], ... SL[M−1] and switches S[0], ... S[M−1]. In some embodiments, each switch SS[0], ... SS[M−1] is connected to a corresponding source line SL[0], ... SL[M−1]. In some embodiments, each switch SS[0], ... SS[M−1] is connected to a corresponding switch S[0], ... S[M−1]. Switches SS[0], ... SS[M−1] are configured to operate in an "open state" or a "closed state." In some embodiments, a "closed state" provides an electrical connection between devices connected to the switches SS[0], ... SS[M−1]. In some embodiments, an "open state" does not provide an electrical connection between devices connected to the switches SS[0], ... SS[M−1]. In some embodiments, one or more of switches SS[0], ... SS[M−1] are implemented by an electrical or mechanical device capable of functioning as a switch. In some embodiments, one or more of switches SS[0], ... SS[M−1] are implemented by the use of NMOS or PMOS transistor devices or a transmission gate. In some embodiments, one or more of switches SS[0], ... SS[M−1] are implemented by one or more switch devices.

In some embodiments, the switch devices (S[0], ... S[M−1] or SS[0], ... SS[M−1]) are configured in an "open state" or a "closed state" based upon whether specific memory cells within memory cell array 112 are "selected" or "unselected". In some embodiments, if data is read from a specific memory cell, then that specific memory cell is "selected." In some embodiments, if data is not read from a specific memory cell, then that specific memory cell is "unselected." For example, if a specific memory cell connected to source line SL[0] is "selected" or read, then switch S[0] or switch SS[0] are open, such that local pull-up unit 108[0] will not send current to the source line SL[0]. For example, if a specific memory cell connected to source line SL[1] is "unselected" or not read, then both switch S[1] and switch SS[1] are closed, such that local pull-up unit 108[1] will send current to the source line SL[1].

In some embodiments, memory unit 100 is used for a read operation of one or more memory cells located in memory cell array 112. In some embodiments, memory unit 100 is used for a verification stage of a write operation of one or more memory cells located in memory cell array 112.

Figure 1B:
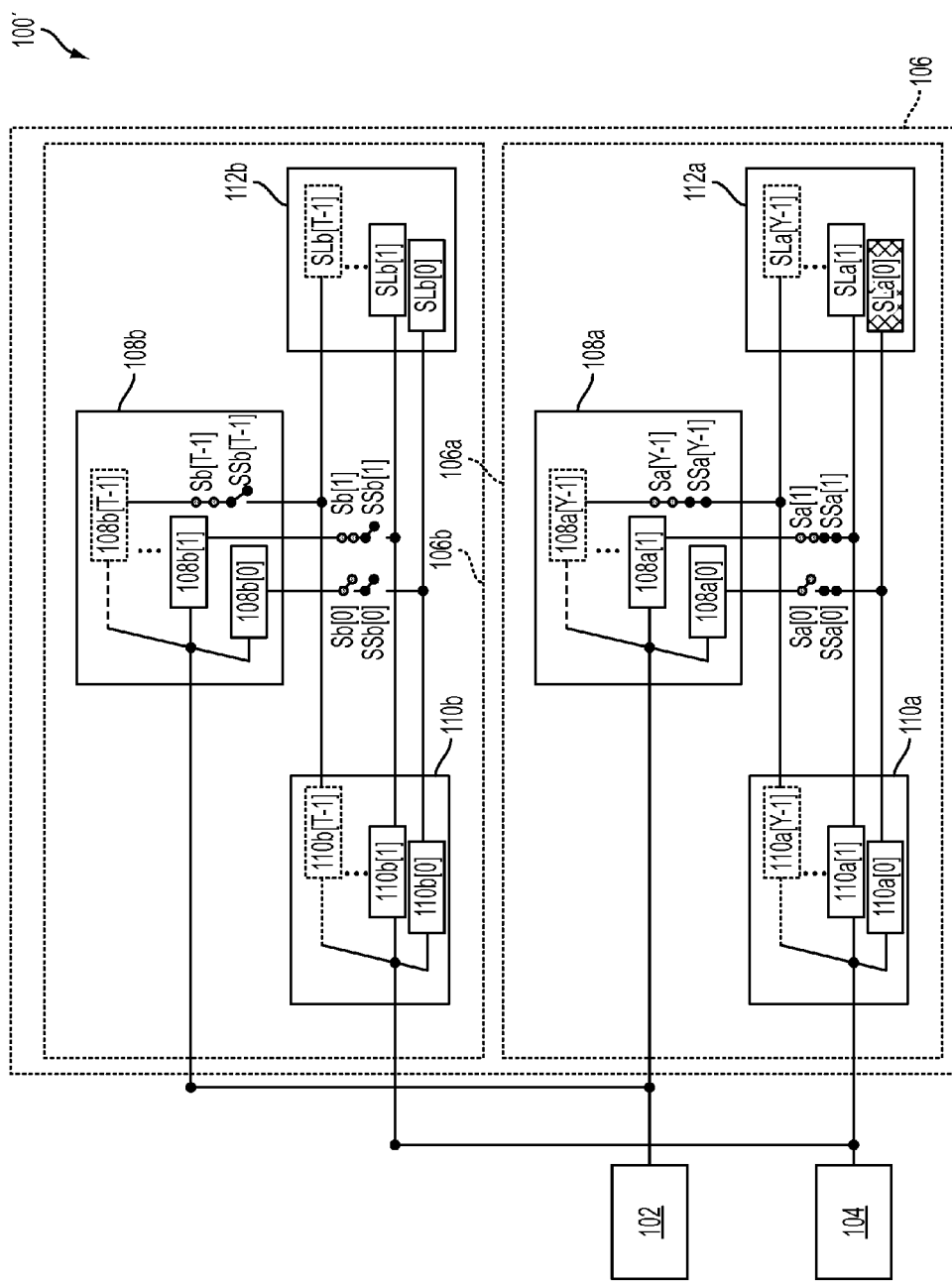
FIG. 1B is a block diagram of a memory unit in accordance with one or more embodiments.

FIG. 1B is a block diagram of a memory unit 100' in accordance with one or more embodiments. Memory unit 100' is an embodiment of the memory unit 100 shown in FIG. 1A. As shown in FIG. 1B, similar elements have a same reference number as shown in FIG. 1B.

Local memory unit 106 is divided into local memory unit 106a and local memory unit 106b. Each of local memory unit 106a and local memory unit 106b include embodiments of the pull-up unit 108, source line decoder 110 and memory cell array 112 contained in local memory unit 106 shown in FIG. 1A. For example, local memory unit 106a includes pull-up unit 108a, source line decoder 110a and memory cell array 112a, and local memory unit 106b includes pull-up unit 108b, source line decoder 110b and memory cell array 112b. In some embodiments, local memory unit 106 is divided into three or more different sectors or regions. A sector is a divided region of a memory cell array 112 based upon a physical size of the memory cell array. In some embodiments, each memory cell array 112 can be divided into a number of smaller memory cell arrays (memory cell array 112a and 112b) by being divided into two or more sectors. In some embodiments, one sector includes a memory cell array including 32 source lines and 1024 bit lines.

As shown in FIG. 1B, memory cell array 112a and memory cell array 112b are portions of different sectors. Memory cell array 112a is characterized as a "selected sector" since a specific memory cell located in memory cell array 112a is part of a read or "selected" sector. Memory cell array 112b is characterized as an "unselected sector" since the memory cells contained in memory cell array 112b are part of an unread or "unselected" sector. As shown in FIG. 1B, the local memory unit 106 is also divided into a "selected sector" (local memory unit 106a) and an "unselected sector" (local memory unit 106b).

Local memory unit 106a comprises pull-up unit 108a, source line decoder 110a and memory cell array 112a. Pull-up unit 108a includes one or more local pull-up units 108a[0], ... 108a[Y−1], where Y is an integer corresponding to the number of local pull-up units in memory cell array 112a. In some embodiments, Y is an integer ranging from 0 to 32. Source line decoder 110a includes one or more local source line decoders 110a[0], ... 110a[Y−1]. Memory cell array 112a includes memory cells (shown in FIGS. 2-6) and source lines SLa[0], ... SLa[Y−1].

Local memory unit 106b comprises pull-up unit 108b, source line decoder 110b and memory cell array 112b. Pull-up unit 108b includes one or more local pull-up units 108b[0], ... 108b[T−1], where T is an integer corresponding to the number of local pull-up units in memory cell array 112b. In some embodiments, T is an integer ranging from 0 to 32. Source line decoder 110b includes one or more local source line decoders 110b[0], ... 110b[T−1]. Memory cell array 112b includes memory cells (shown in FIGS. 2-6) and source lines SLb[0], ... SLb[T−1].

In some embodiments, the switch devices (Sa[0], ... Sa[Y−1], Sb[0], ... Sb[T−1], SSa[0], ... SSa[Y−1] or SSb[0], ... SSb[T−1]) are configured in an "open state" or a "closed state" based upon whether specific memory cells located within memory cell array 112 are "selected" or "unselected." In some embodiments, the switches located in the "unselected sector" or memory cell array 112b (local memory unit 106b) are in an "open state" such that the local pull-up units 108b[0], ... 108b[T−1] will not send current to the source lines SLb[0], ... SLb[T−1].

In some embodiments, for the "selected" memory cell located in the "selected sector," one or more of the corresponding switches (Sa[0], ... Sa[Y−1] or SSa[0], ... SSa[Y−

1]) will be open such that local pull-up unit 108*a*[0], . . . 108*a*[Y−1] will not send current to the source line SLa[0], . . . SLa[Y−1]. For example, if a "selected" or read memory cell located in the selected sector is connected to source line SLa[0], then switch Sa[0] or switch SSa[0] are configured in an open state, such that local pull-up unit 108*a*[0] will not send current to the source line SLa[0].

In some embodiments, for each of the "unselected" memory cells located in the "selected sector," each of the corresponding switches will be closed such that the corresponding local pull-up unit 108*a*[0], . . . 108*a*[Y−1] for each "unselected" memory cell will send current to the corresponding source line. For example, if an "unselected" or unread memory cell is connected to source line SLa[1], then both switch Sa[1] and switch SSa[1] are in a closed state, such that local pull-up unit 108*a*[1] will send current to the corresponding source line SLa[1].

Figure 2:
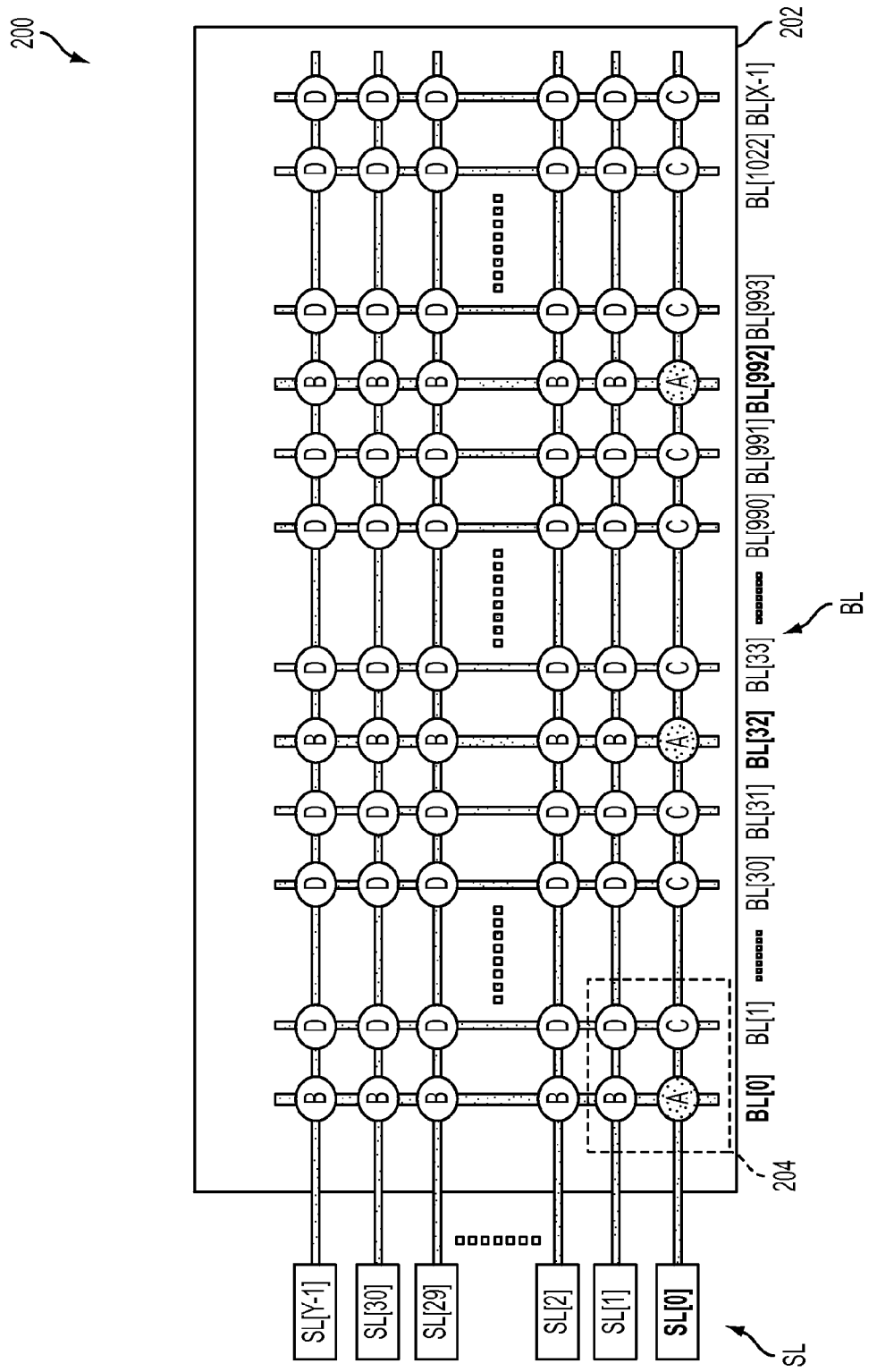
FIG. 2 is a block diagram of a representative portion of a memory cell array in accordance with one or more embodiments.

FIG. 2 is a block diagram of a memory cell array 200 in accordance with one or more embodiments. Memory cell array 200 is an embodiment of the memory cell array 112*a* shown in FIG. 1B. Memory cell array 200 includes memory cells 202, bit lines BL and source lines SL.

Memory cells 202 include an array of memory cells A, B, C and D connected by source lines SL and bit lines BL. In some embodiments, a memory cell is a one transistor (1T) non-volatile memory (NVM) cell. In some embodiments, a memory cell employs a number of transistors other than one. In some embodiments, a memory cell includes one or more NMOS transistors or PMOS transistors.

X bit line (BL) terminals (BL[0], BL[1] . . . BL[X−1]) carry data signals for storage in "selected" memory cells in a column in the memory cell array 200, where X is an integer with a value ranging from 0 to 1024. Bit line terminal BL[0] is electrically connected to the corresponding bit line terminals of memory cells that form column 0 of memory cell array 200. Each of the connections for bit line terminal BL[X−1] repeat for each subsequent column of bit line BL[X−1]. In some embodiments, each memory cell array is divided into one or more sectors. In some embodiments, one sector includes a memory cell array 200 where X is equal to 1024.

Y source line (SL) terminals (SL[0], SL[1] . . . SL[Y−1]) carry data signals for storage in "selected" memory cells in a row in the memory cell array 200, where Y is an integer with a value ranging from 0 to 512. Source line terminal SL[0] is electrically connected to the corresponding source line terminals of memory cells that form row 0 of memory cell array 200. Each of the connections for source line terminal SL[Y−1] repeat for each subsequent row of source line SL[Y−1]. In some embodiments, one sector includes a memory cell array 200 where Y is equal to 32.

A portion of memory cell array 202 is shown as memory cell array 204. Memory cell array 204 includes memory cells A, B, C and D. Memory cells A, B, C and D are connected by source line SL[0], source line SL[1], bit line BL[0] and bit line BL[1]. By way of an illustrative example, a write/read operation is performed to row 0 that includes memory cells A and C by activating the source line terminal SL[0]. For a write/read operation, the bit line terminal BL[0] in column 0 is also active which includes memory cells A and B. Together, the source line terminal SL[0] and bit line terminal BL[0] read/store a binary bit of data in memory cell 202. In this example, memory cell A is selected for reading/writing the binary bit of data because memory cell A is the only memory cell in both row 0 and column 0. However, the remaining cells in row 0 are considered to be "unselected" cells for data reading purposes.

Figure 3:
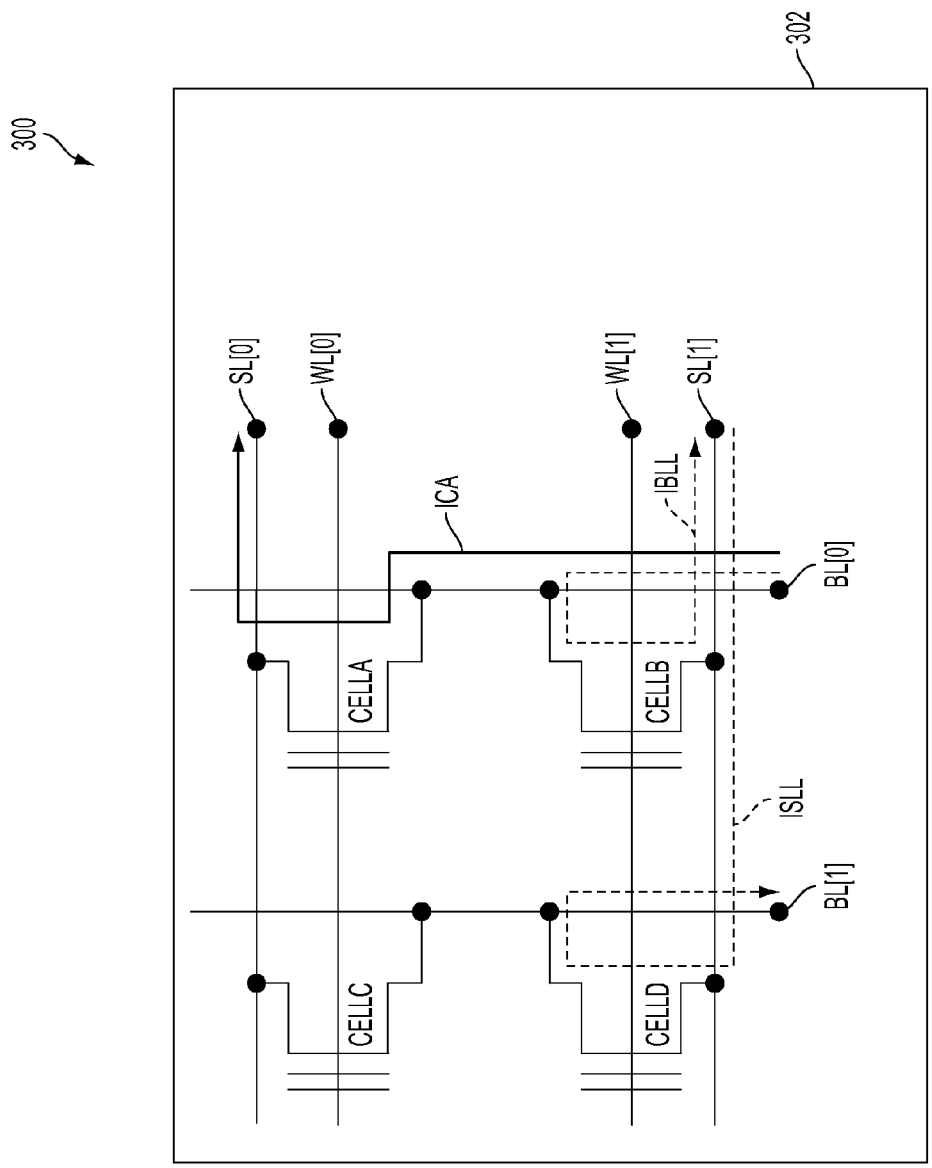
FIG. 3 is a schematic diagram of a representative portion of a two-dimensional (2D) memory cell array in accordance with one or more embodiments.

FIG. 3 is a schematic diagram of a portion of a memory cell array 300 in accordance with one or more embodiments. Memory cell array 300 is an embodiment of the memory cell array 204 shown in FIG. 2. For example, memory cell CellA is an embodiment of memory cell A shown in FIG. 2, memory cell CellB is an embodiment of memory cell B shown in FIG. 2, memory cell CellC is an embodiment of memory cell C shown in FIG. 2 and memory cell CellD is an embodiment of memory cell D shown in FIG. 2. Memory cell array 300 includes memory cells CellA, CellB, CellC and CellD. In some embodiments, a memory cell is a one transistor (1T) non-volatile memory (NVM) cell. In some embodiments, a memory cell employs a number of transistors other than one. In some embodiments, memory cell CellA, CellB, CellC or CellD includes a stacked-gate NMOS transistor. In some embodiments, a memory cell includes a PMOS transistor.

Memory cell CellA is connected to memory cell CellC and memory cell CellB. The gate of memory cell CellA is connected to the gate of memory cell CellC by word line WL[0]. The source of memory cell CellA is connected to the source of memory cell CellC by source line SL[0]. The drain of memory cell CellA is connected to the drain of memory cell CellB by bit line BL[0]. In some embodiments, if data is read from memory cell CellA, current ICA flows from the bit line BL[0] through memory cell CellA and to the source line SL[0].

Memory cell CellB is connected to memory cell CellA and memory cell CellD. The gate of memory cell CellB is connected to the gate of memory cell CellD by word line WL[1]. The drain of memory cell CellB is connected to the drain of memory cell CellA by bit line BL[0]. The source of memory cell CellB is connected to the source of memory cell CellD by source line SL[1]. In some embodiments, bit line leakage current IBLL flows from the bit line BL[O] through memory cell CellB and to the source line SL[1].

Memory cell CellC is connected to memory cell CellA and memory cell CellD. The gate of memory cell CellC is connected to the gate of memory cell CellA by word line WL[0]. The source of memory cell CellC is connected to the source of memory cell CellA by source line SL[0]. The drain of memory cell CellC is connected to the drain of memory cell CellD by bit line BL[1].

Memory cell CellD is connected to memory cell CellB and memory cell CellC. The gate of memory cell CellD is connected to the gate of memory cell CellB by word line WL[1]. The drain of memory cell CellD is connected to the drain of memory cell CellC by bit line BL[1]. The source of memory cell CellD is connected to the source of memory cell CellB by source line SL[1]. In some embodiments, source line leakage current ISLL flows from the source line SL[1] through memory cell CellD and to bit line BL[1].

Figure 4:
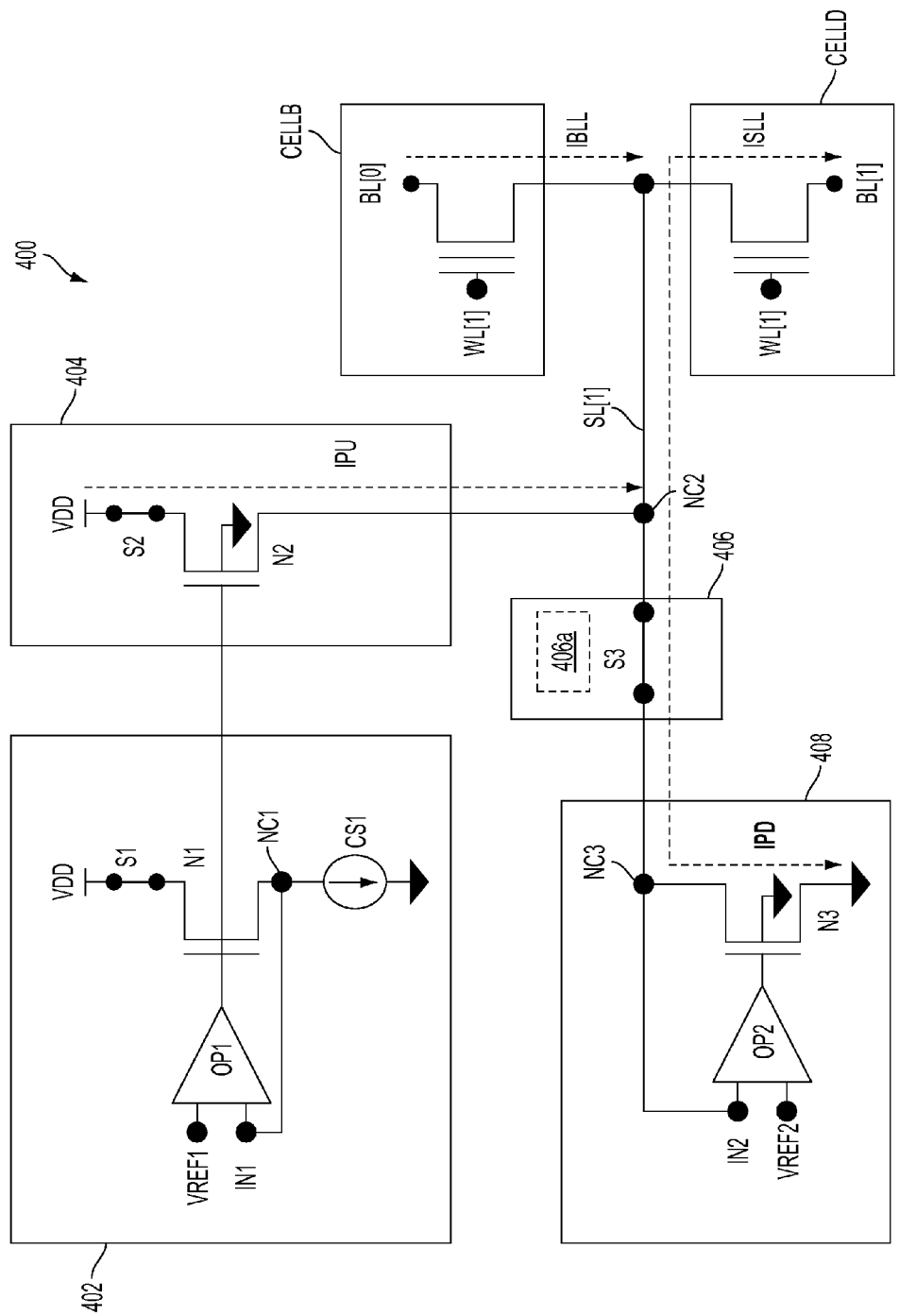
FIG. 4 is a schematic diagram of a memory unit in accordance with one or more embodiments.
Figure 5:
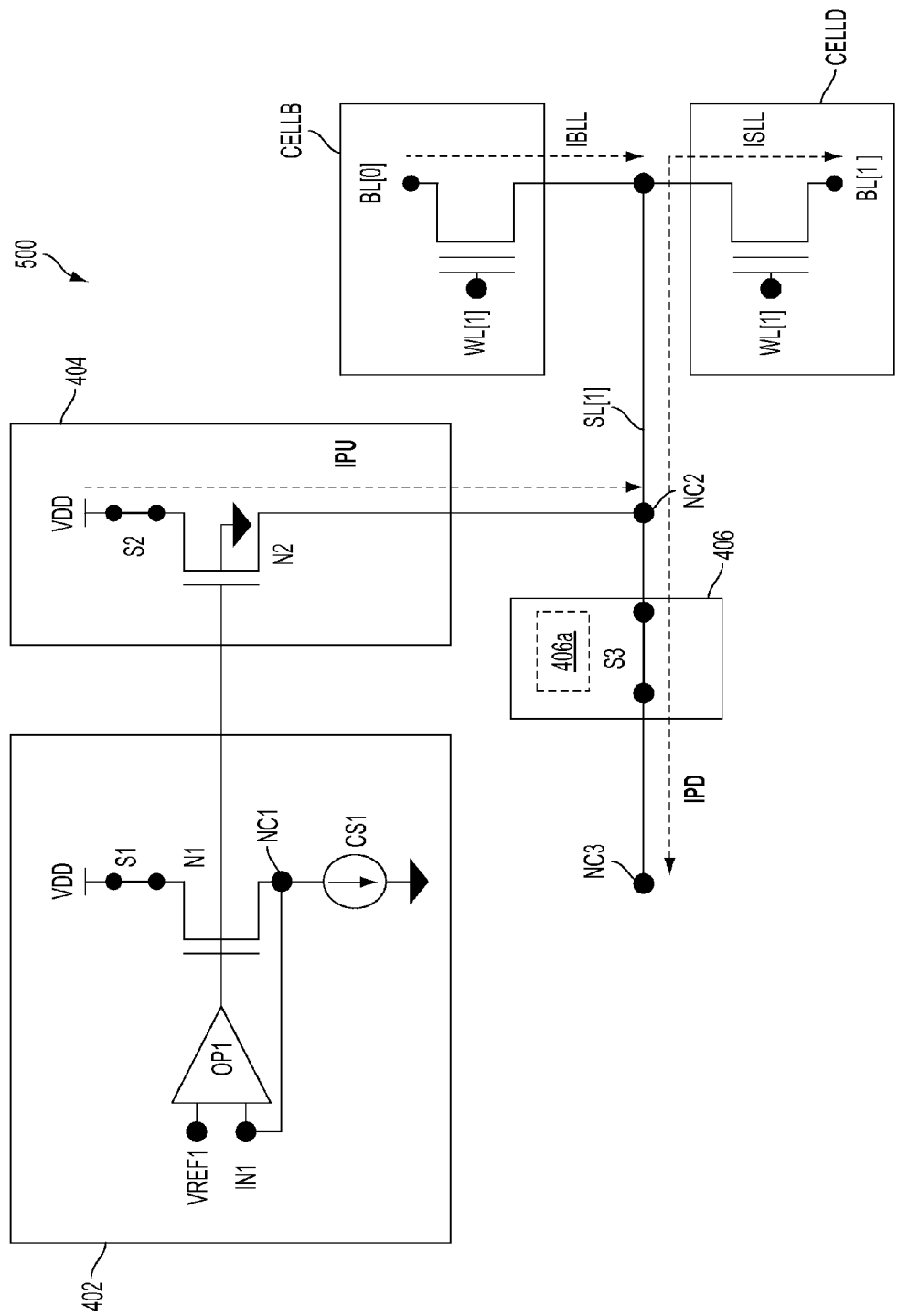
FIG. 5 is a schematic diagram of a memory unit in accordance with one or more embodiments.
Figure 6:
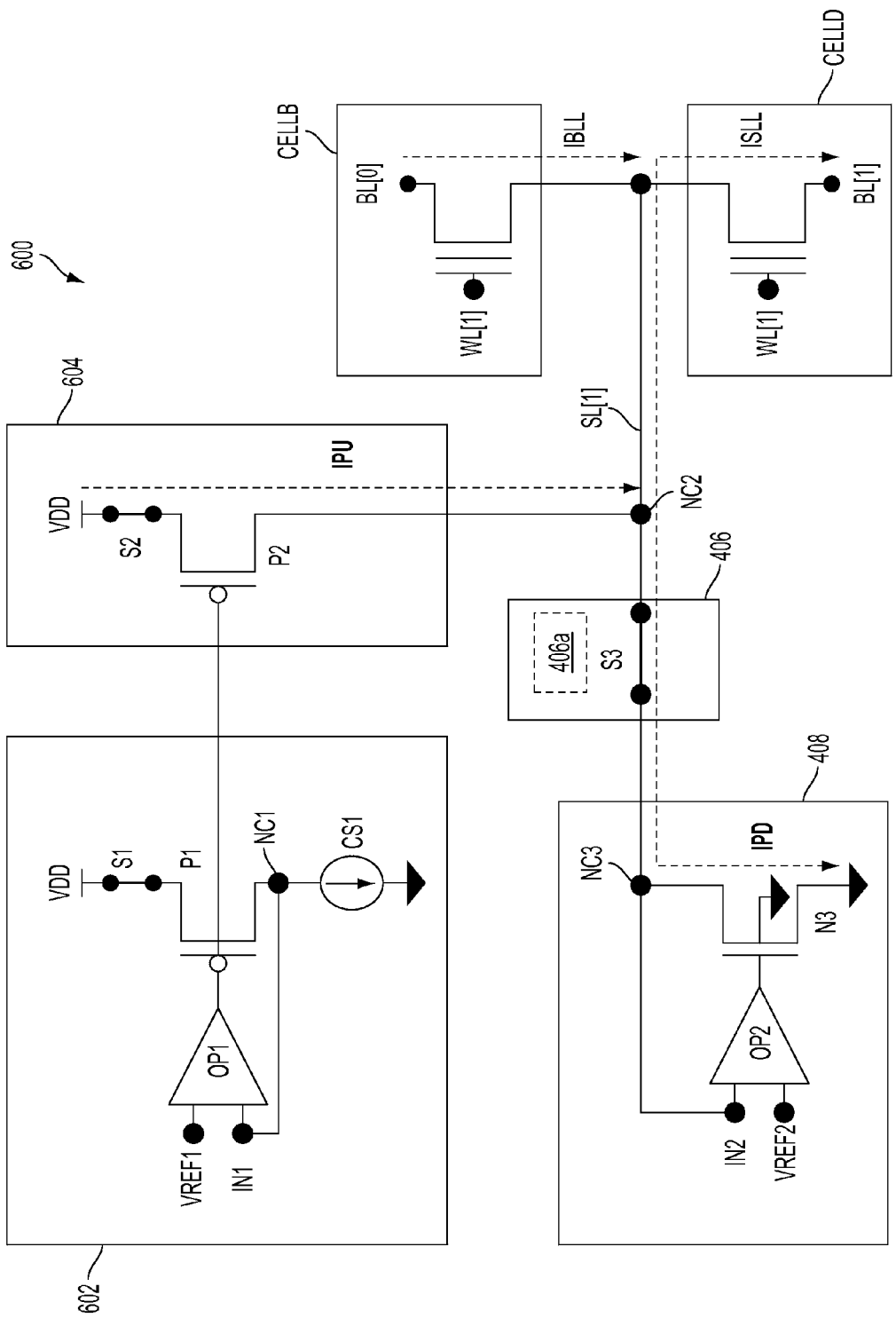
FIG. 6 is a schematic diagram of a memory unit in accordance with one or more embodiments.

In some embodiments, if data is read from memory cell CellA, the bit line BL[0], word line WL[0] and source line SL[O] are "selected," and the bit line BL[1], source line SL[1] and word line WL[1] are "unselected" such that current ICA flows from the bit line BL[O] through memory cell CellA and to the source line SL[0]. In some embodiments, during a read operation of memory cell CellA, reducing the amount of current ICA results in data read errors. In some embodiments, the bit line leakage current IBLL reduces the amount of current ICA resulting in data read errors. In some embodiments, if data is read from memory cell CellA, source line leakage current ISLL is controlled in order to reduce the bit line leakage current IBLL (as shown in FIGS. 4-6). In some embodiments, if data is read from memory cell CellA, the voltage of the bit line BL[0] is substantially equal to 0.8 volts, the voltage of the word line WL[0] is substantially equal to 2.3 volts, the voltage of the bit line BL[1] is substantially equal to 0 volts, the voltage of the word line WL[1] is substantially equal to 0 volts, the voltage of the source line SL[0] is substantially equal to 0 volts and the voltage of the source line SL[1] is substantially equal to 0.2 volts.

FIG. 4 is a schematic diagram of a memory unit 400 in accordance with one or more embodiments. Memory unit 400 is an embodiment of the memory unit 100' shown in FIG. 1B. For example, generator unit 402 is an embodiment of generator 102 shown in FIG. 1B, local pull-up unit 404 is an embodiment of local pull-up unit 108[1] shown in FIG. 1B, source line decoder 406 is an embodiment of source line decoder 110[1] shown in FIG. 1B and regulator unit 408 is an embodiment of regulator unit 104. Further, memory cells CellB and CellD are an embodiment of memory cells CellB and CellD shown in FIG. 3 connected by source line SL[1] and switches S[1] and SS[1] are not shown in FIG. 4, but are both closed.

Generator unit 402 is connected to local pull-up unit 404. Local pull-up unit 404 is connected to regulator unit 408 by source line decoder 406 and source line SL[1]. Local pull-up unit 404 is also connected to memory cells CellB and CellD by source line SL[1]. In some embodiments, generator unit 402 and local pull-up unit 404 are configured to operate as a current mirror.

Generator unit 402 is configured to receive a first input signal VREF1 and a second input signal IN1. Generator unit 402 is configured to send an output signal to local pull-up unit 404. Generator unit 402 includes operational amplifier OP1, current source CS1, NMOS transistor N1 and switch S1.

Operational amplifier OP1 is configured to receive first input signal VREF1 and second input signal IN1. The first input signal VREF1 is a reference voltage at the non-inverting terminal of the operational amplifier OP1. The second input signal IN1 is a voltage at the inverting terminal of the operational amplifier OP1. Operational amplifier OP1 is configured to send an output signal to NMOS transistor N1 and to local pull-up unit 404. The output signal of the operational amplifier OP1 is a voltage applied to the gate of NMOS transistor N1 and local pull-up unit 404. The operational amplifier OP1 includes two input terminals and one output terminal. The first input of the operational amplifier OP1 is connected to the source of the first input signal VREF1. The second input of the operational amplifier OP1 is connected to the source of the second input signal IN1. In some embodiments, operational amplifier OP1 is configured in a negative feedback configuration such that the source of the second input signal IN1 is current source CS1 and the source of NMOS transistor N1. The output of the operational amplifier OP1 is connected to NMOS transistor N1 and NMOS transistor N2 (by local pull-up unit 404).

The gate of NMOS transistor N1 is connected to operational amplifier OP1 and is configured to receive the output signal of the operational amplifier OP1. The drain of NMOS transistor N1 is connected to voltage source VDD by switch S1. The source of NMOS transistor N1 is connected to current source CS1 and the input of operational amplifier OP1 by node NC1. The generator unit 402 is configured to maintain the voltage at node NC1 is substantially equal to first input signal VREF1. In some embodiments, given a first input signal VREF1 approximately equal to 0.2 volts, the generator unit 402 is configured to maintain the voltage at node NC1 is approximately equal to 0.2 volts.

Switch S1 is connected to the drain of NMOS transistor N1 and voltage source VDD. Switch S1 is configured to operate in an "open state" or a "closed state." In some embodiments, a "closed state" provides an electrical connection between devices connected to the switch S1. In some embodiments, an "open state" does not provide an electrical connection between devices connected to the switch S1. In some embodiments, switch S1 is implemented by an electrical or mechanical device capable of functioning as a switch. In some embodiments, switch S1 is implemented by the use of NMOS or PMOS transistor devices or a transmission gate. In some embodiments, switch S1 is implemented by one or more switch devices.

Current source CS1 is connected to the source of NMOS transistor N1, the input of operational amplifier OP1 and to ground. Current source CS1 is configured to provide a reference electric current for generator unit 402. In some embodiments, generator unit 402 and local pull-up unit 404 are configured to operate as a current mirror. In some embodiments, current source CS1 is a constant current source. In some embodiments, current source CS1 is configured to set the voltage at node NC1.

Local pull-up unit 404 is configured to receive an output signal from generator unit 402. Local pull-up unit 404 is configured to send a pull-up current IPU to source line decoder 406 and memory cells CellB and CellD by source line SL[1]. Local pull-up unit 404 includes NMOS transistor N2 and switch S2. The local pull-up unit 404 is configured to send pull-up current IPU toward the source line SL[1] and to pull the source line SL[1] towards VDD. However, the regulator unit 408 maintains the voltage of the source line SL[1] at a fixed voltage approximately equal to fourth input signal VREF2, which prevents the local pull-up unit 404 from pulling the source line SL[1] substantially to VDD. In some embodiments, generator unit 402 and local pull-up unit 404 are configured to operate as a current minor. For example, current source CS1 is used to set the gate voltage of NMOS transistors N1 and N2; and the gate voltage of NMOS transistor N2 is used to set the pull-up current IPU.

The gate of NMOS transistor N2 is connected to generator unit 402 (by operational amplifier OP1 and the gate of NMOS transistor N1) and is configured to receive the output signal of the operational amplifier OP1. The drain of NMOS transistor N2 is connected to voltage source VDD by switch S2. The source of NMOS transistor N2 is connected to source line decoder 406 and memory cells CellB and CellD by node NC2 of source line SL[1]. The body of NMOS transistor N2 is connected to ground.

Switch S2 is connected to the drain of NMOS transistor N2 and voltage source VDD. Switch S2 is configured to operate in an "open state" or a "closed state." In some embodiments, a "closed state" provides an electrical connection between devices connected to the switch S2. In some embodiments, an "open state" does not provide an electrical connection between devices connected to the switch S2. In some embodiments, switch S2 is implemented by an electrical or mechanical device capable of functioning as a switch. In some embodiments, switch S2 is implemented by the use of NMOS or PMOS transistor devices or a transmission gate. In some embodiments, switch S2 is implemented by one or more switch devices.

Source line decoder 406 includes logic 406a and switch S3. Switch S3 is configured to operate in an "open state" or a "closed state." In some embodiments, a "closed state" provides an electrical connection between devices connected to the switch S3. In some embodiments, an "open state" does not provide an electrical connection between devices connected to the switch S3. In some embodiments, switch S3 is implemented by an electrical or mechanical device capable of functioning as a switch. In some embodiments, switch S3 is implemented by the use of NMOS or PMOS transistor devices or a transmission gate. In some embodiments, switch S3 is implemented by one or more switch devices. Logic 406a includes logic configured to operate as a source line decoder or source line driver. In some embodiments, source line decoder 406 determines the corresponding source line of each accessed individual memory cell (for example, CellB and CellD) to be turned on or off based on the address of the accessed memory cell.

Regulator unit 408 is configured to receive third input signal IN2 and fourth input signal VREF2. Regulator unit 408 is configured to send an output signal to source line decoder 406. Regulator unit 408 includes operational amplifier OP2 and NMOS transistor N3.

Operational amplifier OP2 is configured to receive third input signal IN2 and fourth input signal VREF2. The third input signal IN2 is a reference voltage at the inverting terminal of the operational amplifier OP2. The fourth input signal VREF2 is a voltage at the non-inverting terminal of the operational amplifier OP2. Operational amplifier OP2 is configured to send an output signal to NMOS transistor N3. The output signal of the operational amplifier OP2 is a voltage applied to the gate of NMOS transistor N3. The operational amplifier OP2 includes two input terminals and one output terminal. The first input of the operational amplifier OP2 is connected to the source of the third input signal IN2. The second input of the operational amplifier OP2 is connected to the source of the fourth input signal VREF2. In some embodiments, operational amplifier OP2 is configured in a negative feedback configuration such that the source of the third input signal IN2 is the drain of NMOS transistor N3. The output of the operational amplifier OP2 is connected to NMOS transistor N2.

The gate of NMOS transistor N3 is connected to operational amplifier OP2 and is configured to receive the output signal of the operational amplifier OP2. The drain of NMOS transistor N3 is connected to source line decoder 406 by node NC3. The source of NMOS transistor N3 is connected to ground. The regulator unit 408 is configured to maintain the voltage at node NC3 is substantially equal to fourth input signal VREF2. In some embodiments, if fourth input signal VREF2 is substantially equal to 0.2 volts, then regulator unit 408 is configured to maintain the voltage at node NC3 is approximately 0.2 volts. The regulator unit 408 is configured to maintain the voltage at node NC2 is also substantially equal to fourth input signal VREF2. In some embodiments, regulator unit 408 is configured to maintain the voltage at node NC2 is approximately 0.2 volts. In some embodiments, pull down current IPD flows from the source line SL[1] through source line decoder 406 and regulator unit 408. In some embodiments, source line decoder 406 and regulator unit 408 reduce the pull down current IPD which also decreases the corresponding IR drop across the source line decoder 406.

Memory cell CellD is connected to bit line BL[1], memory cell CellB and source line SL[1]. In some embodiments, memory cell CellD is an NMOS transistor. The gate of memory cell CellD is connected to word line WL[1]. The source of memory cell CellD is connected to source line SL[1] and memory cell CellB. The drain of memory cell CellD is connected to bit line BL[1]. In some embodiments, source line leakage current ISLL flows from the source line SL[1] through memory cell CellD and to bit line BL[1].

Memory cell CellB is connected to bit line BL[0], memory cell CellD and source line SL[1]. In some embodiments, memory cell CellB is an NMOS transistor. The gate of memory cell CellB is connected to word line WL[1]. The source of memory cell CellB is connected to source line SL[1] and memory cell CellD. The drain of memory cell CellB is connected to bit line BL[0]. In some embodiments, bit line leakage current IBLL flows from the bit line BL[0] through memory cell CellB and to the source line SL[1]. In some embodiments, the bit line leakage current IBLL is controlled and reduced by the implementation shown in FIG. 4. In some embodiments, the implementation shown in FIG. 4 reduces the bit line leakage current IBLL by providing the source line leakage current ISLL (which is provided by the pull-down current IPD). In some embodiments, in order to reduce the bit line leakage current IBLL, the voltage of the source line SL[1] is maintained at about 0.2 volts by regulator unit 408, the voltage of the bit line BL[1] is about 0 volts, the voltage of the bit line BL[0] is about 0.8 volts and the voltage of the word line WL[1] is about 0 volts.

FIG. 5 is a schematic diagram of a memory unit 500 in accordance with one or more embodiments. Memory unit 500 is an embodiment of the memory unit 400 shown in FIG. 4 without regulator unit 408. As shown in FIG. 5, similar elements have a same reference number as shown in FIG. 4. In some embodiments, node NC3 is a floating node not connected to other devices such that the pull down current IPD is 0 amperes.

In some embodiments, the bit line leakage current IBLL is controlled and reduced by the implementation shown in FIG. 5. In some embodiments, the implementation shown in FIG. 5 reduces the bit line leakage current IBLL by providing the source line leakage current ISLL. In some embodiments, in order to reduce the bit line leakage current IBLL, the source line leakage current ISLL is provided by pull-up current IPU. The local pull-up unit 404 is configured to send pull-up current IPU to the source line SL[1] and to pull the source line SL[1] towards VDD. In some embodiments, without the use of the regulator unit 408, the voltage of the source line SL[1] is allowed to be pulled-up toward VDD. In some embodiments, the voltage of the source line SL[1] is greater than 0.2 volts. In some embodiments, the voltage of the source line SL[1] is maintained above 0.2 volts, the voltage of the bit line BL[1] is about 0 volts, the voltage of the bit line BL[0] is about 0.8 volts and the voltage of the word line WL[1] is about 0 volts.

FIG. 6 is a schematic diagram of a memory unit 600 in accordance with one or more embodiments. Memory unit 600 is an embodiment of the memory unit 400 shown in FIG. 4 using PMOS transistors P1 and P2 (in generator unit 602 and local pull-up unit 604). As shown in FIG. 6, similar elements have a same reference number as shown in FIG. 4. Memory unit 600 includes generator unit 602, local pull-up unit 604, source line decoder 406, regulator unit 408 and memory cells CellB and CellD.

Generator unit 602 is connected to local pull-up unit 604. Local pull-up unit 604 is connected to regulator unit 408 by source line decoder 406 and source line SL[1]. Local pull-up unit 604 is also connected to memory cells CellB and CellD by source line SL[1].

Generator unit 602 is configured to receive first input signal VREF1 and second input signal IN1. Generator unit 602 is configured to send an output signal to local pull-up unit 604. Generator unit 602 includes operational amplifier OP1, current source CS1, PMOS transistor P1 and switch S1.

Operational amplifier OP1 is configured to receive first input signal VREF1 and second input signal IN1. The first input signal VREF1 is a reference voltage at the non-inverting terminal of the operational amplifier OP1. The second input signal IN2 is a voltage at the inverting terminal of the operational amplifier OP1. Operational amplifier OP1 is configured to send an output signal to PMOS transistor P1 and to local pull-up unit 604. The output signal of the operational amplifier OP1 is a voltage applied to the gate of PMOS transistor P1 and local pull-up unit 604. The operational amplifier OP1 includes two input terminals and one output terminal. The first input of the operational amplifier OP1 is connected to the source of the first input signal VREF1. The second input of the operational amplifier OP1 is connected to the source of the second input signal IN1. In some embodiments, operational amplifier OP1 is configured in a negative feedback configuration such that the source of the second input signal IN1 is current source CS1 and the drain of PMOS transistor P1. The output of the operational amplifier OP1 is connected to PMOS transistor P1 and PMOS transistor P2 (by local pull-up unit 604).

The gate of PMOS transistor P1 is connected to operational amplifier OP1 and is configured to receive the output signal of the operational amplifier OP1. The source of PMOS transistor P1 is connected to voltage source VDD by switch S1. The drain of PMOS transistor P1 is connected to current source CS1 and the input of operational amplifier OP1 by node NC1. The generator unit 602 is configured to maintain the voltage at node NC1 is substantially equal to first input signal VREF1. In some embodiments, for a first input signal VREF1 approximately equal to 0.2 volts, the generator unit 602 is configured to maintain the voltage at node NC1 is approximately equal to 0.2 volts.

Switch S1 is connected to the source of PMOS transistor P1 and voltage source VDD. Switch S1 is configured to operate in an "open state" or a "closed state." In some embodiments, a "closed state" provides an electrical connection between devices connected to the switch S1. In some embodiments, an "open state" does not provide an electrical connection between devices connected to the switch S1. In some embodiments, switch S1 is implemented by an electrical device or other suitable device capable of functioning as a switch. In some embodiments, switch S1 is implemented by the use of NMOS or PMOS transistor devices or a transmission gate. In some embodiments, switch S1 is implemented by one or more switch devices.

Current source CS1 is connected to the drain of PMOS transistor P1, the input of operational amplifier OP1 and to ground. Current source CS1 is configured to provide a reference electric current for generator unit 602. In some embodiments, generator unit 602 and local pull-up unit 604 are configured to operate as a current mirror. In some embodiments, current source CS1 is a constant current source. In some embodiments, current source CS1 is configured to set the voltage at node NC1.

Local pull-up unit 604 is configured to receive an output signal from generator unit 602. Local pull-up unit 604 is configured to send a pull-up current IPU to source line decoder 406 and memory cells CellB and CellD by source line SL[1]. Local pull-up unit 604 includes PMOS transistor P2 and switch S2. The local pull-up unit 604 is configured to send pull-up current IPU towards the source line SL[1] and to pull the source line SL[1] towards VDD. However, the regulator unit 408 maintains the voltage of the source line SL[1] at a fixed voltage approximately equal to the fourth input signal VREF2, which prevents the local pull-up unit 604 from pulling the source line SL[1] substantially to VDD. In some embodiments, generator unit 602 and local pull-up unit 604 are configured to operate as a current minor. For example, current source CS1 is used to set the gate voltage of PMOS transistors P1 and P2; and the gate voltage of PMOS transistor P2 is used to set the pull-up current IPU.

The gate of PMOS transistor P2 is connected to generator unit 602 (by operational amplifier OP1 and the gate of PMOS transistor P1) and is configured to receive the output signal of the operational amplifier OP1. The source of PMOS transistor P2 is connected to voltage source VDD by switch S2. The drain of PMOS transistor P2 is connected to source line decoder 406 and memory cells CellB and CellD by node NC2 of source line SL[1].

Switch S2 is connected to the source of PMOS transistor P2 and voltage source VDD. Switch S2 is configured to operate in an "open state" or a "closed state." In some embodiments, a "closed state" provides an electrical connection between devices connected to the switch S2. In some embodiments, an "open state" does not provide an electrical connection between devices connected to the switch S2. In some embodiments, switch S2 is implemented by an electrical or mechanical device capable of functioning as a switch. In some embodiments, switch S2 is implemented by the use of NMOS or PMOS transistor devices or a transmission gate. In some embodiments, switch S2 is implemented by one or more switch devices.

In some embodiments, the bit line leakage current IBLL is controlled and reduced by the implementation shown in FIG. 6. In some embodiments, the implementation shown in FIG. 6 reduces the bit line leakage current IBLL by providing the source line leakage current ISLL (by pull-up current IPU). In some embodiments, in order to reduce the bit line leakage current IBLL, the source line leakage current ISLL is provided by pull-up current IPU. The local pull-up unit 604 is configured to send pull-up current IPU to the source line SL[1] and to pull the source line SL[1] towards VDD. However, the regulator unit 408 maintains the voltage of the source line SL[1] at a fixed voltage approximately equal to fourth input signal VREF2, which prevents the local pull-up unit 604 from pulling the source line substantially to VDD. In some embodiments, in order to reduce the bit line leakage current IBLL, the voltage of the source line SL[1] is maintained at about 0.2 volts by regulator unit 408, the voltage of the bit line BL[1] is about 0 volts, the voltage of the bit line BL[0] is about 0.8 volts and the voltage of the word line WL[1] is about 0 volts.

Figure 7B:
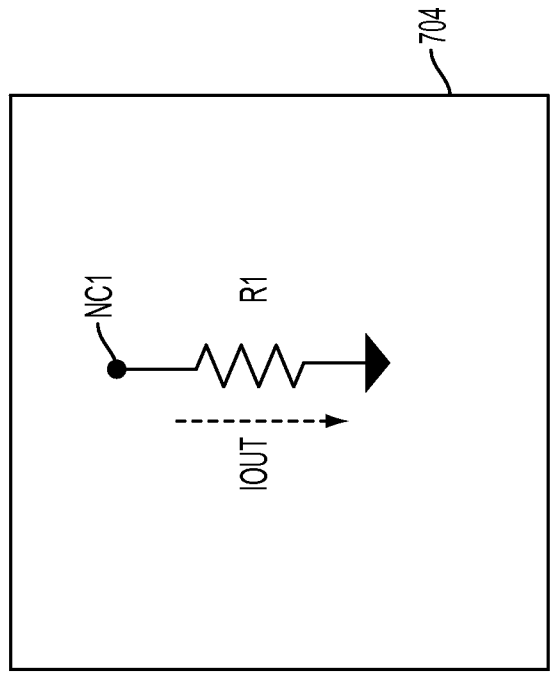
FIG. 7B is a schematic diagram of a current source in accordance with one or more embodiments.
Figure 7A:
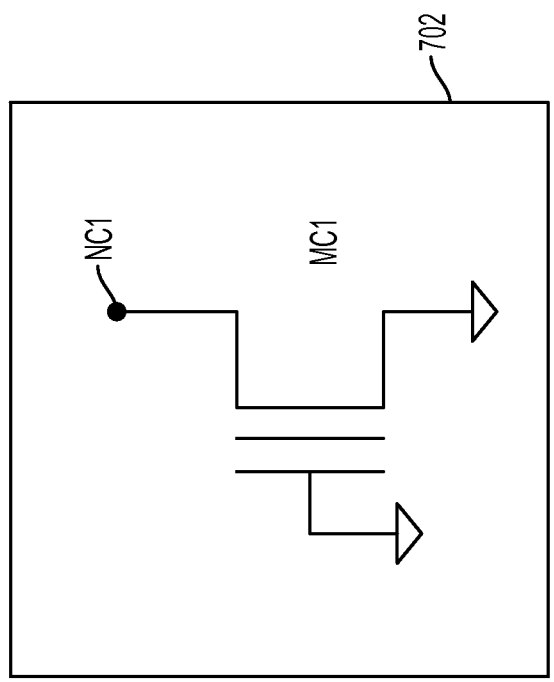
FIG. 7A is a schematic diagram of a current source in accordance with one or more embodiments.

FIG. 7A is a schematic diagram of a current source 702 in accordance with one or more embodiments. Current source 702 is an embodiment of the current source CS1 shown in FIGS. 4-6. As shown in FIG. 7A, similar elements have a same reference number as shown in FIGS. 4-6. Current source 702 includes a memory cell MC1. Memory cell MC1 is an embodiment of memory cell CellD shown in FIG. 3. In some embodiments, the number of memory cells MC1 is equal to the number of memory cells in array 202. In some embodiments, the number of memory cells MC1 ranges from about 1 memory cell to about an integer Y (as described in FIG. 2). In some embodiments, the number of memory cells MC1 ranges from about 1 to about 100. The gate and source of memory cell MC1 is connected to ground. The drain of memory cell 702 is connected to node NC1 (shown in FIGS. 4-6).

FIG. 7B is a schematic diagram of a current source 704 in accordance with one or more embodiments. Current source 704 is an embodiment of the current source CS1 shown in FIGS. 4-6. As shown in FIG. 7B, similar elements have a same reference number as shown in FIGS. 4-6. Current source 704 includes resistor R1. Resistor R1 is connected to ground and node NC1 (shown in FIGS. 4-6). In some embodiments, the output current TOUT of current source 706 is sufficiently constant across a range of operating temperatures. In some embodiments, the output current TOUT of current source 706 remains sufficiently constant as the operating temperature of the current source 706 is increased.

Figure 7C:
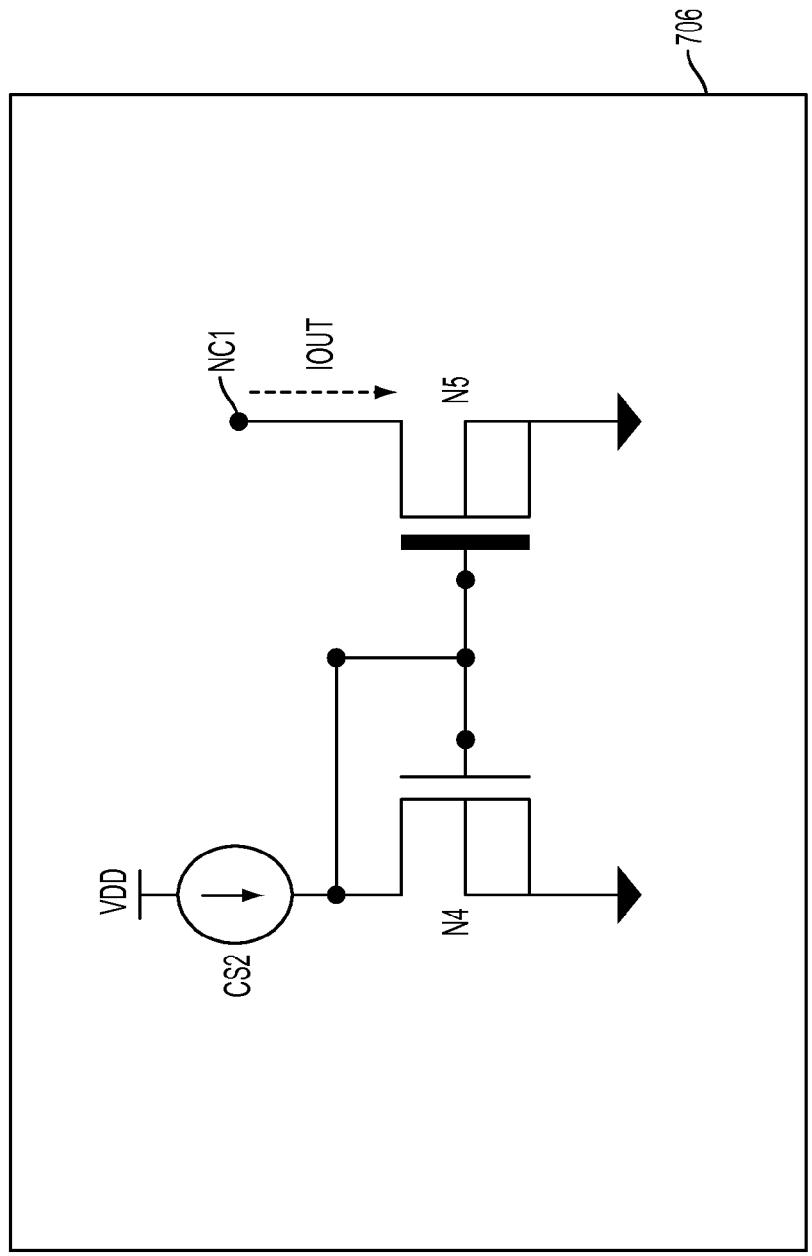
FIG. 7C is a schematic diagram of a current source in accordance with one or more embodiments.

FIG. 7C is a schematic diagram of a current source 706 in accordance with one or more embodiments. Current source 706 is an embodiment of the current source CS1 shown in FIGS. 4-6. As shown in FIG. 7C, similar elements have a same reference number as shown in FIGS. 4-6. Current source 706 includes current source CS2, NMOS transistor N4 and NMOS transistor N5. In some embodiments, current source 706 is a current mirror such that the output current TOUT is directly proportional to the current provided by current source CS2.

Current source CS2 is connected to voltage source VDD, the drain of NMOS transistor N4, the gate of NMOS transistor N4 and the gate of NMOS transistor N5. Current source CS2 is configured to provide a reference electric current for current source 706. In some embodiments, current source CS2 is a constant current source. In some embodiments, current source CS2 is configured to set the gate voltage of NMOS transistor N4 and NMOS transistor N5.

The drain of the NMOS transistor N4 is connected to current source CS2. The source of the NMOS transistor N4 is connected to ground. The gate of the NMOS transistor N4 is connected to the gate of the NMOS transistor N5 and current source CS2. In some embodiments, the threshold voltage for NMOS transistor N4 is a low voltage. In some embodiments, NMOS transistor N4 is utilized for 1.8V operation with a thinner gate oxide thickness such that the threshold voltage is substantially equal to 0.5V.

The drain of the NMOS transistor N5 is configured to provide the output current TOUT. The drain of the NMOS transistor N5 is connected to node NC1 (shown in FIGS. 4-6). The source of the NMOS transistor N5 is connected to ground. The gate of the NMOS transistor N5 is connected to the gate of the NMOS transistor N5. In some embodiments, NMOS transistor N5 is utilized for 5V operation with a thicker gate oxide thickness such that the threshold voltage is substantially equal to 0.8V. In some embodiments, the threshold voltage of NMOS transistor N5 is substantially equal to 5.0 volts. In some embodiments, the output current TOUT of current source 706 are sufficiently linear across a range of operating temperatures. In some embodiments, the output current TOUT of current source 706 linearly decreases as the operating temperature of the current source 706 is increased. In some embodiments, the output current TOUT of current source 706 is sufficiently greater than the reference current (current source CS2).

In at least some embodiments, during a read or write operation, the memory units 400, 500 and 600 (as shown in FIGS. 4-6) substantially reduce the leakage current in the "unselected" bit line resulting in faster setup times. In at least some embodiments, during a read or write operation, the memory units 400, 500 and 600 (as shown in FIGS. 4-6) substantially reduce the leakage current in the "unselected" bit line resulting in a better controlled bias level on the cell side of the source line. In at least some embodiments, during a read or write operation, the memory units 400, 500 and 600 (as shown in FIGS. 4-6) substantially reduce the leakage current in the "unselected" bit line resulting in reduces read margin errors.

Figure 8:
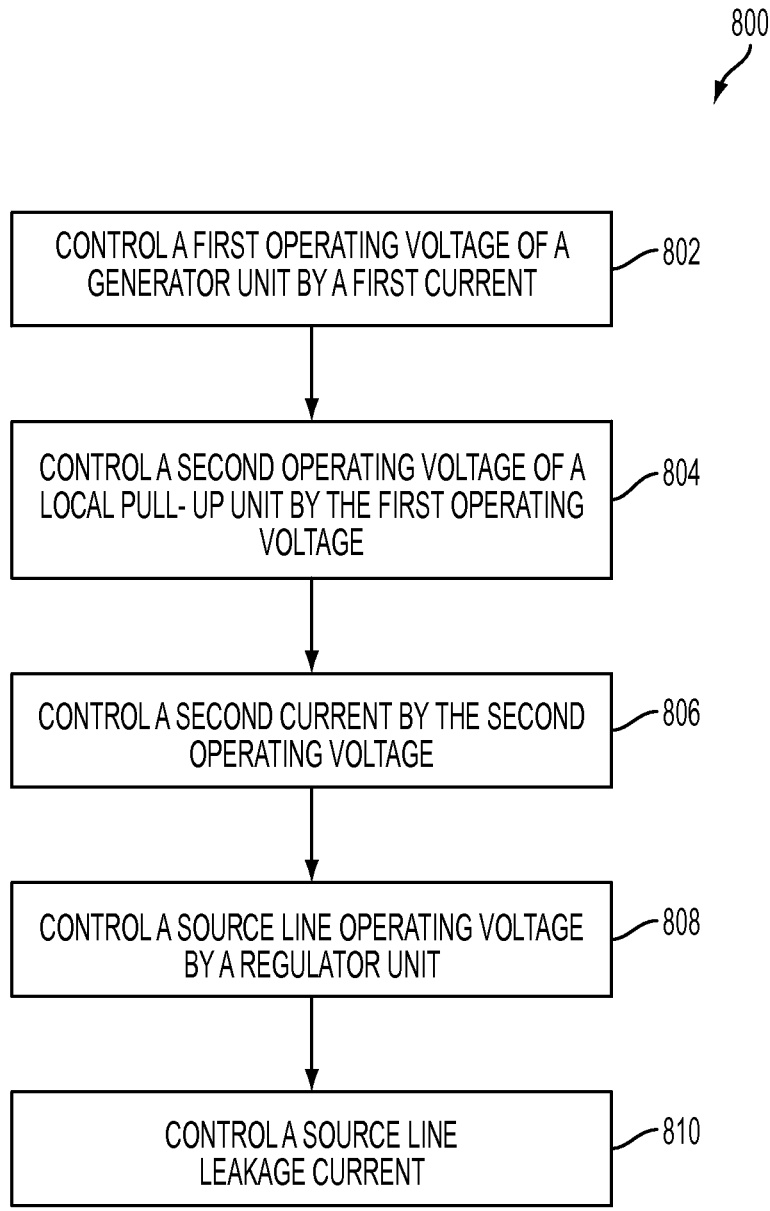
FIG. 8 is a flow chart illustrating a method in accordance with one or more embodiments.

FIG. 8 is a flow chart illustrating a method 800 of reducing bit line leakage current in accordance with one or more embodiments. Method 800 begins with operation 802 in which a first operating voltage of a generator unit is controlled by a first current.

In operation 802, a second operating voltage of a local pull-up unit is controlled by the first operating voltage.

In operation 804, a second current is controlled by the second operating voltage. In some embodiments, the second current sets a source line current.

In operation 806, a source line operating voltage is controlled by a regulator unit.

In operation 808, a source line leakage current is controlled.

Figure 9:
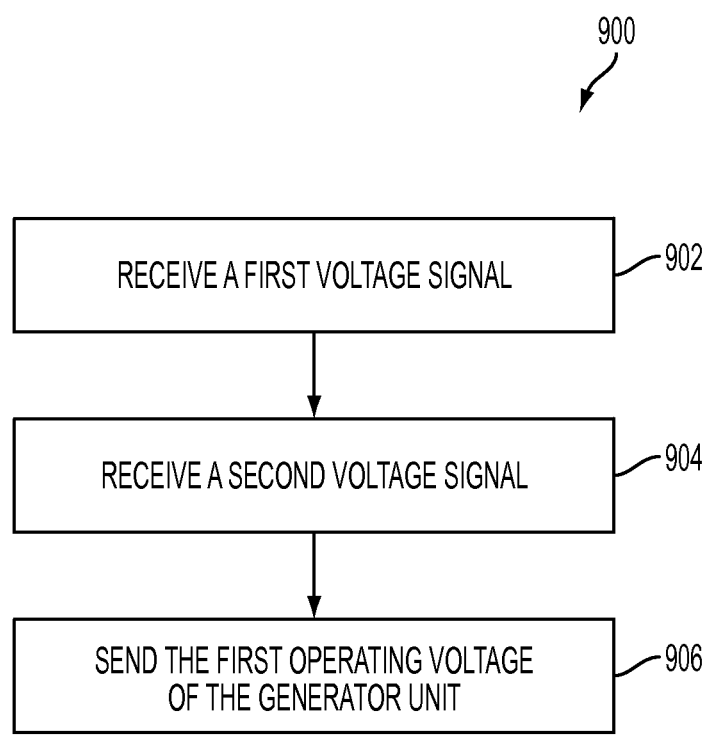
FIG. 9 is a flow chart illustrating a method in accordance with one or more embodiments.

FIG. 9 is a flow chart illustrating a method 900 of controlling a first operating voltage of a generator unit in accordance with one or more embodiments. Method 900 is an embodiment of operation 802 shown in method 800. Method 900 begins with operation 902 in which a first voltage signal is received. In some embodiments, the first voltage signal is a reference voltage.

In operation 902, a second voltage signal is received. In some embodiments, the second voltage signal is determined by the first current.

In operation 904, the first operating voltage of the generator unit is sent.

Figure 10:
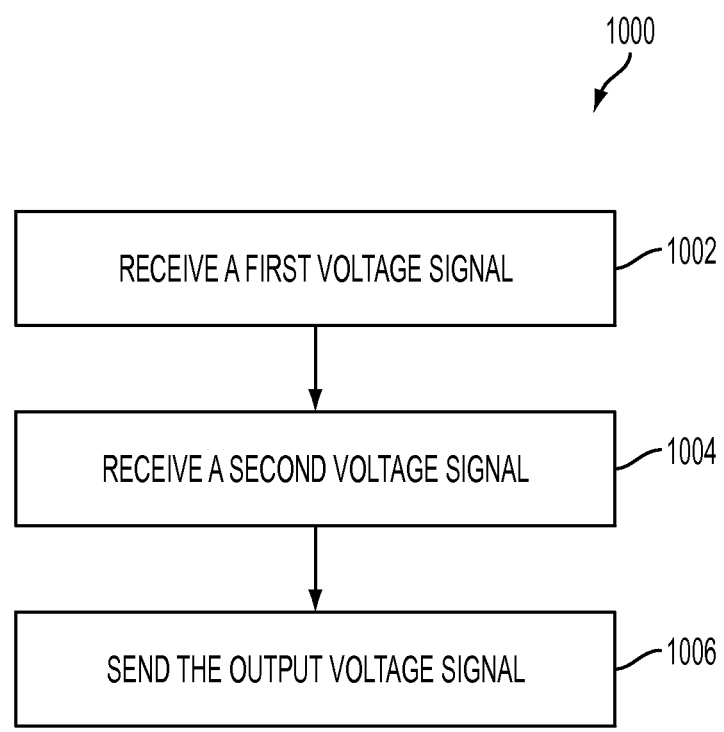
FIG. 10 is a flow chart illustrating a method in accordance with one or more embodiments.

FIG. 10 is a flow chart illustrating a method 1000 of controlling a source line operating voltage in accordance with one or more embodiments. Method 1000 is an embodiment of operation 806 shown in method 800. Method 1000 begins with operation 1002 in which a first voltage signal is received. In some embodiments, the first voltage signal is a reference voltage.

In operation 1004, a second voltage signal is received.

In operation 1006, an output voltage signal is sent. In some embodiments, the output voltage signal controls the source line operating voltage. In some embodiments, the second voltage signal is determined by the source line operating voltage.

One aspect of this description relates to an integrated circuit. The integrated circuit includes one or more pull-up units, a generator unit and an array of memory cells. The one or more pull-up units are connected to one or more source lines. Each pull-up unit of the one or more pull-up units is connected with a corresponding source line of the one or more source lines and is configured to set a current of the corresponding source line of the one or more source lines. The generator unit is connected to the one or more pull-up units. Further, the generator unit is configured to set a first voltage signal of each pull-up unit of the one or more pull-up units. The array of memory cells are connected to the one or more source lines, wherein the array of memory cells is electrically connected to the one or more source lines and one or more bit lines.

Another aspect of this description relates to an integrated circuit. The integrated circuit includes one or more pull-up units, a generator unit, an array of memory cells and a regulator unit. The one or more pull-up units are connected to one or more source lines, wherein each pull-up unit is connected with a corresponding source line of the one or more source lines and is configured to set a current of the corresponding source line of the one or more source lines. The generator unit is connected to the one or more pull-up units, wherein the generator unit is configured to set a first voltage signal of each pull-up unit of the one or more pull-up units. The array of memory cells are connected to the one or more source lines, wherein the array of memory cells is electrically connected to the one or more source lines and one or more bit lines. The regulator unit is connected to the one or more source lines, wherein the regulator unit is configured to set a source line voltage of each source line of the one or more source lines.

Still another aspect of this description relates to method of reducing a bit line leakage current. The method of reducing a bit line leakage current comprising controlling a first operating voltage of a generator unit by a first current, controlling a second operating voltage of a local pull-up unit by the first operating voltage, controlling a second current of the local pull-up unit by the second operating voltage, controlling a source line operating voltage by a regulator unit and controlling a source line leakage current. Also, the second current sets a source line current.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit, comprising:
   one or more pull-up units connected to one or more source lines, wherein each pull-up unit of the one or more pull-up units is connected with a corresponding source line of the one or more source lines and is configured to set a current of the corresponding source line of the one or more source lines;
   a generator unit connected to the one or more pull-up units, wherein the generator unit is configured to set a first voltage signal of each pull-up unit of the one or more pull-up units, and the generator unit comprises an operational amplifier; and
   an array of memory cells connected to the one or more source lines, wherein the array of memory cells is electrically connected to the one or more source lines and one or more bit lines.

2. The integrated circuit of claim 1, further comprising one or more source line decoders, wherein each source line of the one or more source lines is connected with a corresponding source line decoder of the one or more source line decoders.

3. The integrated circuit of claim 2, further comprising:
   a regulator unit connected to the one or more source line decoders, wherein the regulator unit is configured to set a source line voltage of each source line of the one or more source lines.

4. The integrated circuit of claim 3, wherein the regulator unit comprises:
   a first N-type transistor;
   a first terminal of the first N-type transistor configured as a first input node to receive a second voltage signal;
   a second terminal of the first N-type transistor configured as a first output node and is connected to one or more source line decoders;
   a third terminal of the first N-type transistor coupled to a ground; and
   a fourth terminal is coupled to the ground.

5. The integrated circuit of claim 4, wherein the regulator unit further comprises:
   an operational amplifier;
   a first terminal of the operational amplifier configured as a second input node to receive a third voltage signal;
   a second terminal of the operational amplifier configured to receive a fourth voltage signal; and
   a third terminal of the operational amplifier coupled to the first terminal of the first N-type transistor, wherein the first terminal of the operational amplifier is connected to the second terminal of the first N-type transistor.

6. The integrated circuit of claim 1, wherein each pull-up unit of the one or more pull-up units comprises:
   a first N-type transistor;
   a first terminal of the first N-type transistor configured as a first input node to receive the first voltage signal;
   a second terminal of the first N-type transistor configured as a first output node to send a first output current signal to the corresponding source line of the one or more source lines in response to the first voltage signal;
   a third terminal of the first N-type transistor coupled to a source voltage; and
   a fourth terminal connected to a ground.

7. The integrated circuit of claim 6, wherein each pull-up unit of the one or more pull-up units further comprises:
   a first switch;
   a first terminal of the first switch connected to the source voltage; and
   a second terminal of the first switch connected to the third terminal of the first N-type transistor.

8. The integrated circuit of claim 7, wherein the generator unit further comprises:
   a second N-type transistor;
   a first terminal of the second N-type transistor configured as a second input node to receive a second voltage signal;
   a second terminal of the second N-type transistor configured as a second output node and connected to a current source to generate a second output current signal in response to the second voltage signal; and
   a third terminal of the second N-type transistor coupled to the source voltage.

9. The integrated circuit of claim 8, wherein the generator unit further comprises:
   a second switch;
   a first terminal of the second switch connected to the source voltage; and
   a second terminal of the second switch connected to the third terminal of the second N-type transistor.

10. The integrated circuit of claim 8, wherein the operational amplifier comprises:
    a first terminal of the operational amplifier configured as a third input node to receive a third voltage signal;
    a second terminal of the operational amplifier configured to receive a fourth voltage signal; and
    a third terminal of the operational amplifier coupled to at least one of the first terminal of the second N-type transistor or the first terminal of the first N-type transistor, wherein the second terminal of the operational amplifier is connected to the second terminal of the second N-type transistor.

11. An integrated circuit, comprising:
    one or more pull-up units connected to one or more source lines, wherein each pull-up unit is connected with a corresponding source line of the one or more source lines and is configured to set a current of the corresponding source line of the one or more source lines;
    a generator unit connected to the one or more pull-up units, wherein the generator unit is configured to set a first voltage signal of each pull-up unit of the one or more pull-up units;
    an array of memory cells connected to the one or more source lines, wherein the array of memory cells is electrically connected to the one or more source lines and one or more bit lines; and
    a regulator unit connected to the one or more source lines, wherein the regulator unit is configured to set a source line voltage of each source line of the one or more source lines.

12. The integrated circuit of claim 11, further comprising one or more source line decoders, wherein each source line of the one or more source lines is connected with a corresponding source line decoder of the one or more source line decoders.

13. The integrated circuit of claim 11, wherein each pull-up unit of the one or more pull-up units comprises:
- a first P-type transistor;
- a first terminal of the first P-type transistor configured as a first input node to receive the first voltage signal;
- a second terminal of the first P-type transistor configured as a first output node to send a first output current signal to the corresponding source line of the one or more source lines in response to the first voltage signal; and
- a third terminal of the first P-type transistor coupled to a source voltage.

14. The integrated circuit of claim 13, wherein each pull-up unit of the one or more pull-up units further comprises:
- a first switch;
- a first terminal of the first switch connected to the source voltage; and
- a second terminal of the first switch connected to the third terminal of the first P-type transistor.

15. The integrated circuit of claim 13, wherein the generator unit comprises:
- a second P-type transistor;
- a first terminal of the second P-type transistor configured as a second input node to receive a second voltage signal;
- a second terminal of the second P-type transistor configured as a second output node and connected to a current source to generate a second output current signal in response to the second voltage signal; and
- a third terminal of the second P-type transistor coupled to the source voltage.

16. The integrated circuit of claim 15, wherein the generator unit further comprises:
- a second switch;
- a first terminal of the second switch connected to the source voltage; and
- a second terminal of the second switch connected to the third terminal of the second P-type transistor.

17. The integrated circuit of claim 15, wherein the generator unit further comprises:
- an operational amplifier;
- a first terminal of the operational amplifier configured as a third input node to receive a third voltage signal;
- a second terminal of the operational amplifier configured to receive a fourth voltage signal; and
- a third terminal of the operational amplifier coupled to at least one of the first terminal of the second P-type transistor or the first terminal of the first P-type transistor,
- wherein the second terminal of the operational amplifier is connected to the second terminal of the second P-type transistor.

18. A method of reducing a bit line leakage current, the method comprising:
- controlling a first operating voltage of a generator unit by a first current;
- controlling a second operating voltage of a local pull-up unit by the first operating voltage;
- controlling a second current of the local pull-up unit by the second operating voltage, wherein the second current sets a source line current;
- controlling a source line operating voltage by a regulator unit; and
- controlling a source line leakage current.

19. The method of claim 18, wherein controlling the first operating voltage of the generator unit comprises:
- receiving a first voltage signal, wherein the first voltage signal is a reference voltage;
- receiving a second voltage signal, wherein the second voltage signal is determined by the first current; and
- sending the first operating voltage of the generator unit.

20. The method of claim 18, wherein controlling the source line operating voltage comprises:
- receiving a first voltage signal, wherein the first voltage signal is a reference voltage;
- receiving a second voltage signal; and
- sending an output voltage signal;
- wherein the output voltage signal controls the source line operating voltage, and the second voltage signal is determined by the source line operating voltage.

* * * * *